United States Patent [19]
Kiyota et al.

[11] Patent Number: 5,395,802
[45] Date of Patent: Mar. 7, 1995

[54] PROCESS FOR MAKING SEMICONDUCTOR ACCELERATION SENSOR HAVING ANTI-ETCHING LAYER

[75] Inventors: Shigeyuki Kiyota; Hideo Muro, both of Yokohama, Japan

[73] Assignee: Nissan Motor Co., Ltd., Yokohama, Japan

[21] Appl. No.: 37,335

[22] Filed: Mar. 26, 1993

[30] Foreign Application Priority Data

Mar. 31, 1992 [JP] Japan .................................. 4-077830

[51] Int. Cl.6 .......................................... H01L 21/465
[52] U.S. Cl. ..................... 437/228; 437/90; 437/927
[58] Field of Search ...................... 437/228, 927, 901; 257/254, 417–420

[56] References Cited

U.S. PATENT DOCUMENTS

| 4,332,000 | 5/1982 | Petersen ............... 257/419 |
| 4,618,397 | 10/1986 | Shimizu et al. ......... 156/647 |
| 4,721,938 | 1/1988 | Stevenson .............. 156/644 |

FOREIGN PATENT DOCUMENTS

| 63-308390 | 12/1988 | Japan . |
| 64-18063 | 1/1989 | Japan . |
| 3-196576 | 8/1991 | Japan . |

OTHER PUBLICATIONS

Roylance et al., "A Batch-Fabricated Silicon Accelerometer," *IEEE Trans. Electron Devices*, vol. ED-26, No. 12, pp. 1911–1917 (Dec. 1979).

*Primary Examiner*—Olik Chaudhuri
*Assistant Examiner*—H. Jey Tsai
*Attorney, Agent, or Firm*—Foley & Lardner

[57] ABSTRACT

A semiconductor acceleration transducer is fabricated so that the semiconductor beam and the piezoelectric transducing element are accurately positioned relative to each other, and the impact resistance is improved. The fabrication process comprises a wafer preparing step for forming a buried layer between a substrate of a first conductivity type and an epitaxial layer of a second conductivity type, a doping step for forming a diffusion region of the first conductivity type in the epitaxial layer, and an etching step for removing unwanted portions of the substrate and the diffusion region from the bottom of the substrate to shape the beam supporting portion serving as a seismic mass. The buried layer is formed at such a position that the shape and position of the beam is determined by the buried layer. The buried layer may be a second conductivity type layer to determine the contour of the beam by stopping the etching process or may be a first conductivity type layer which is etched away to determine the contour of the beam with its diffusion contour.

25 Claims, 9 Drawing Sheets

PROCESS FOR MAKING SEMICONDUCTOR ACCELERATION SENSOR HAVING ANTI-ETCHING LAYER

BACKGROUND OF THE INVENTION

The present invention relates to a fabrication process and the structure of a semiconductor (solid-state) acceleration sensor or transducer.

In a conventional process, a semiconductor beam (such as a silicon cantilever) of an acceleration transducer is formed by etching from the backside of the sensor chip while the piezoresistive transducing element is formed by doping from the topside. Therefore, the conventional fabrication process requires a double side alignment technique, which is difficult to carry out and inaccurate. Moreover, the thickness beam is changed abruptly at each of the supported end of the beam and the movable end of the beam, so that the conventional acceleration transducer is susceptible to stress concentration and impact damage.

SUMMARY OF THE INVENTION

It is an object of the present invention to provide a fabricating process and structure for a semiconductor acceleration sensor or transducer which can accurately and reliably determine the relative position between the transducing element and the semiconductor beam.

It is another object of the present invention to provide a fabricating process and a structure of a semiconductor acceleration sensor or transducer which can accurately and reliably determine the relative position between the transducing element and the semiconductor beam and which can make a beam less susceptible to stress concentration and more resistant to damage due to impact.

According to the present invention, a fabricating process for fabricating a semiconductor acceleration sensor (or transducer) comprising at least one beam portion and a mass portion supported by said beam portion, comprises a preparing step, a diffused resistor forming step, an anti-etching film forming step and an etching step. The preparing step may comprise first and second steps, and the process may further comprise a third step. In this case, the resistor forming step is a fourth step, the anti-etching film forming step is a fifth step and the etching step is a sixth step.

The first step is forming at least one buried layer extending into a semiconductor substrate of a first conductivity type (such as the P type) from a first major surface (such as a top surface) of said semiconductor substrate.

The second step is growing an epitaxial layer of a second conductivity type (such as the N type) on the first major surface of said semiconductor substrate.

The third step is forming a diffusion region of the first conductivity type in the epitaxial layer so that the diffusion region surrounds the portion in which the beam portion and the mass portion are to be formed.

The fourth step is forming a diffused resistor region of the first conductivity type by doping it in such a manner that the diffused resistor region is formed above the buried region, and the diffused resistor region extends into said epitaxial layer from a top surface of said epitaxial layer.

The fifth step is selectively forming an insulating layer on a second major surface (such as a bottom surface) of the semiconductor substrate.

The sixth step is forming the beam portion and the mass portion by selectively etching away the semiconductor substrate and the diffused region from the second major surface of said substrate by using the insulating layer as a mask.

In one embodiment of the invention, the buried layer comprises first and second buried regions of the second conductivity type, and the diffused resistor region is formed above a region between the first and second buried regions. These buried regions are left behind without being etched away in the sixth step so that the shape and position of the beam are determined by the buried regions.

In another embodiment, the buried layer is of the first conductivity type. This buried layer is etched away by the sixth etching step so that the shape and position of the beam are determined by the buried layer.

In either case, the relative position the between the transducing element and the beam is accurately determined by the buried layer. Furthermore, the buried layer (or regions) determines the shape of the beam so that the thickness of the beam varies smoothly at each end of the beam. The process and structure of the present invention can mitigate stress concentration and improve the impact resistance.

DETAILED DESCRIPTION OF THE INVENTION

FIGS. 1A-3B show a semiconductor acceleration sensor (comprising at least a semiconductor acceleration transducer) and a fabrication process for fabricating the acceleration sensor, according to a first embodiment of the present invention.

Figure 1A:
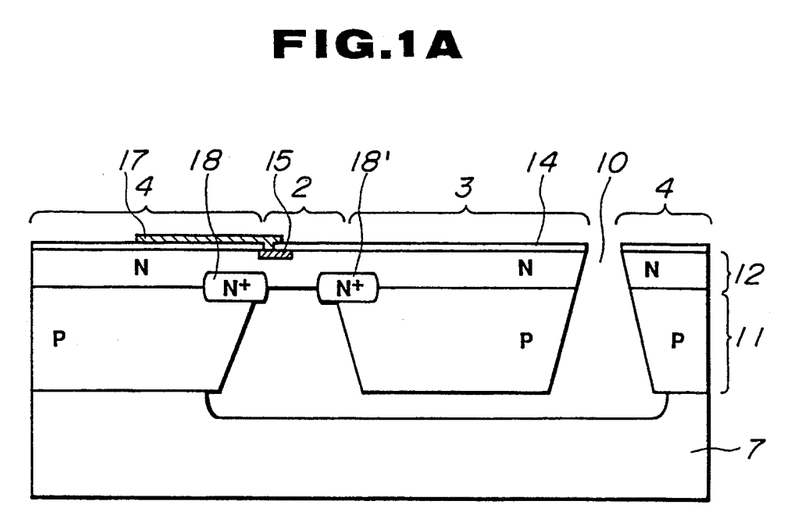
FIG. 1A is a sectional view, taken across a line IA—IA in FIG. 1B, for showing a semiconductor acceleration sensor according to a first embodiment of the present invention.
Figure 1B:
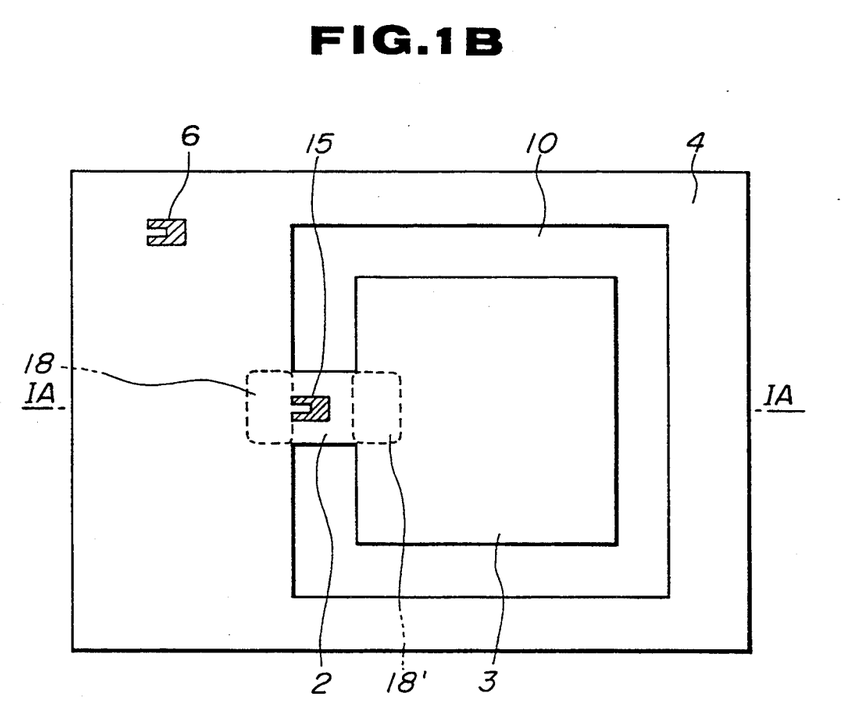
FIG. 1B is a plan view of the semiconductor sensor shown in FIG. 1A.

FIG. 1B shows the lateral geometry of the semiconductor acceleration sensor according to the first embodiment. FIG. 1A shows the structural cross section taken across a line IA—IA of FIG. 1B. In the plan view of FIG. 1B, interconnection electrodes and oxide films are omitted for simplification.

This semiconductor acceleration sensor includes a semiconductor piece (chip) mounted on a base 7. The semiconductor piece of this example includes a P type (100) silicon substrate 11 and an N type epitaxial layer 12 formed on the P substrate 11. The P substrate 11 has a top surface on which the epitaxial layer 12 is grown, and a bottom surface which is attached to the base 7.

The semiconductor piece has a beam portion 2, a seismic mass portion 3 and a support portion 4. A cavity (void portion) 10 is formed by selective etching. The beam portion 2 is thinner than each of the mass portions 3 and the support portion 4. In the beam portion 2, the P substrate 11 is etched away from the bottom surface, so that the cavity 10 extends below the seismic mass 3, and the bottom surface of the epitaxial layer 12 is bared in the cavity 10. The beam portion 2 extends from the support portion 4, to the mass portion 3. In this example, the beam portion 2 is in the form of a cantilever. The beam portion 2 has a supported end supported by the support portion 4, and a free movable end carrying the mass portion 3. As shown in FIG. 1B, the mass portion 3 is surrounded by the cavity 10 which is, in turn, surrounded by the support portion 4, and the beam portion 2 extends from the support portion 4 to the mass portion 3 like a bridge.

The acceleration sensor has first and second P-type piezoresistors 15 and 6 which are substantially identical to each other. The first piezoresistor 15 is formed in the top surface of the beam portion 2. The second P-type piezoresistor 6 is formed in the top surface of the support portion 4. These two piezoresistors 15 and 6 are electrically connected to form a bridge circuit.

Acceleration applied to this sensor causes the mass portion 3 to move up and down, and accordingly the beam 2 to bend. The piezoresistor 15 receives stresses due to this bending motion (or deflection) of the beam 2, and changes in resistance. This change of the resistance of the sensing piezoresistor 15 is measured to determine the acceleration.

The acceleration sensor shown in FIGS. 1A and 1B further includes a buried layer which, in this embodiment, consists of first and second N+-type buried regions 18 and 18'. The buried regions 18 and 18' are bounded between the epitaxial layer 12 and the P substrate 11. Each buried region 18 or 18' may be approximately shaped like an ellipse. The first buried region 18 is formed at and near the supported end of the beam 2, and the second buried region 18' is at and near the free end of the beam 2. Each buried region 18 or 18' is left without being etched away, and partly exposed in the cavity 10. Therefore, the beam 2 is thicker in the supported end and the free end than in the middle portion of the beam 2 between the supported end and the free end. In the lateral layout shown in FIG. 1B, the sensing piezoresistor 18 is located between the first and second buried regions 18 and 18'.

FIGS. 2A–3B show the fabricating process for the semiconductor sensor (or transducer) shown in FIGS. 1A and 1B. The fabrication process includes at least the following six fabrication steps.

Figure 2A:
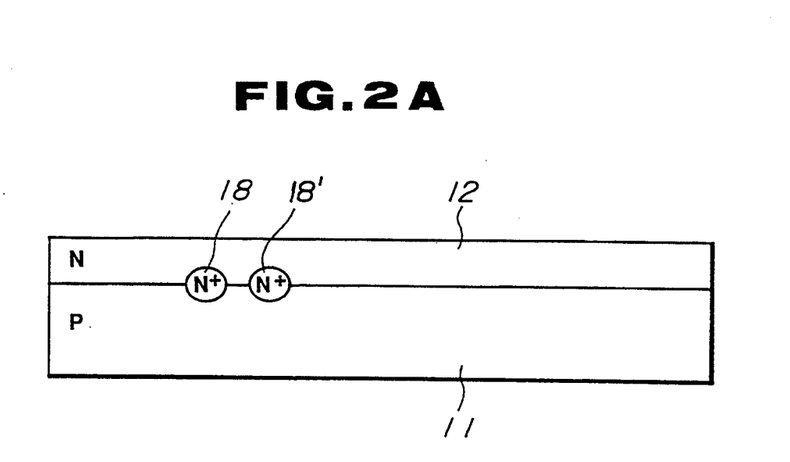
FIGS. 2A-2C and FIGS. 3A and 3B are sectional views for showing a fabricating process for fabricating the semiconductor sensor shown in FIGS. 1A and 1B.

The first step is for forming the first and second N+-type buried regions 18 and 18' in the P-type silicon substrate 11 by diffusion of a large quantity of N-type impurity atoms (such as Sb) from the top surface of the substrate 11.

The second step is for forming the N-type epitaxial layer 12 on the P substrate 11. By this epitaxy step, the buried regions 18 and 18' are actually buried under the epitaxial layer 12, as shown in FIG. 2A. These first two steps constitute a preparing stage for preparing an epitaxial wafer (chip) including a buried layer.

Figure 2B:
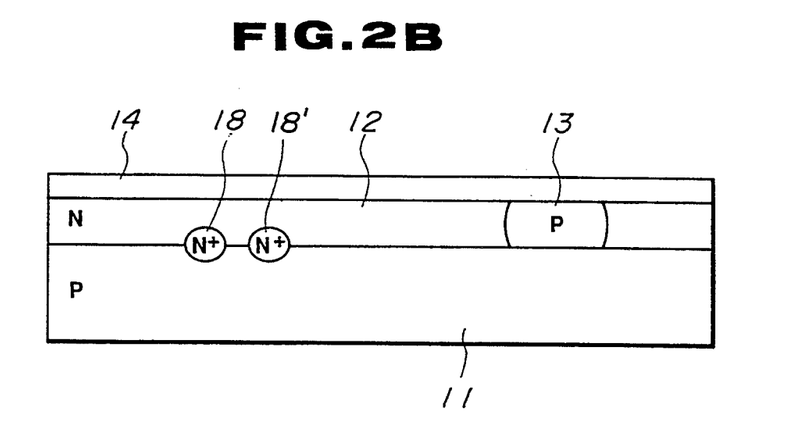

The third step is shown in FIG. 2B. This step is to form a P-type diffusion region 13 as shown in FIG. 2B. This step is achieved by depositing, on the top surface of the epitaxial layer 12, a P-type impurity such as boron, and driving the deposited impurity atoms into the epitaxial layer 12. The thus-formed P diffusion region 13 extends into the epitaxial layer 12 from the top surface of the epitaxial layer 12, and reaches the P substrate 11 as shown in FIG. 2B. The P diffusion region 13 surrounds the mass portion 3 like the lateral configuration of the cavity 10 shown in FIG. 1B. In this step, an oxide film 14 is formed on the N epitaxial layer 12 as shown in FIG. 2B.

The fourth step is for forming the P-type piezoresistor 15 in the top surface of the N epitaxial layer 12. The piezoresistor 15 is formed in the <110> direction. This step is achieved, for instance, by ion implantation of boron. The reference piezoresistor 6 can be formed simultaneously with the sensing resistor 15.

Figure 2C:
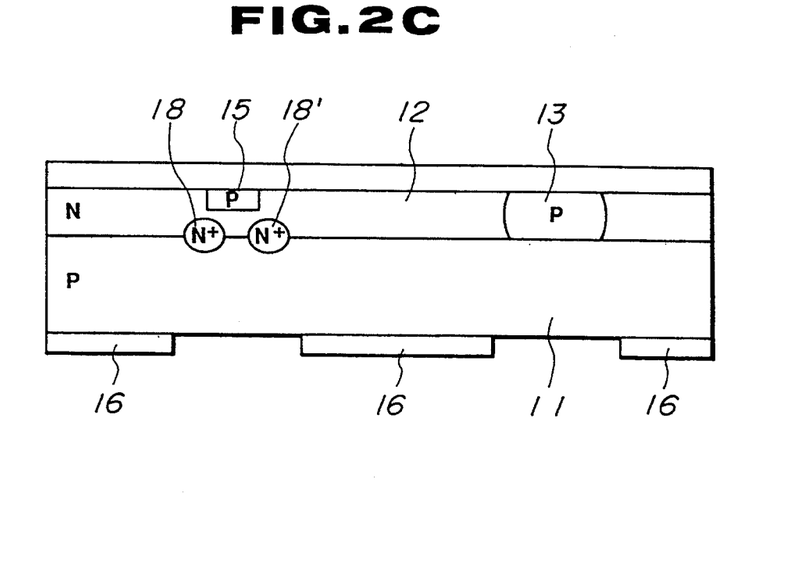

The fifth step is for forming a patterned anti-etch insulating layer 16 on the bottom surface of the silicon substrate 11. In this example, the insulating layer 16 is a silicon nitride layer (of $Si_3N_4$). The step is achieved by forming the silicon nitride layer on the entirety of the bottom surface of the silicon substrate 11, and then patterning the silicon nitride layer by selectively removing the silicon nitride layer just below the piezoresistor 15 and the diffusion region 13 as shown in FIG. 2C.

Figure 3A:
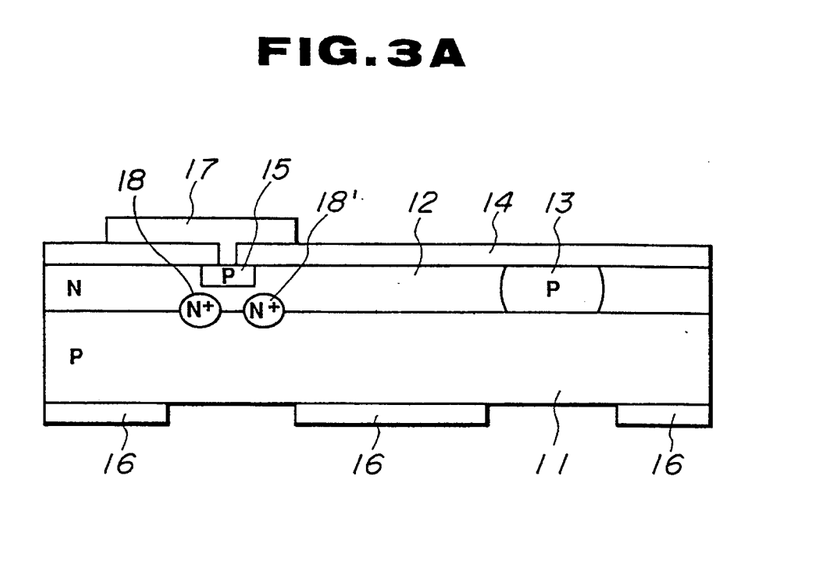
Figure 3B:
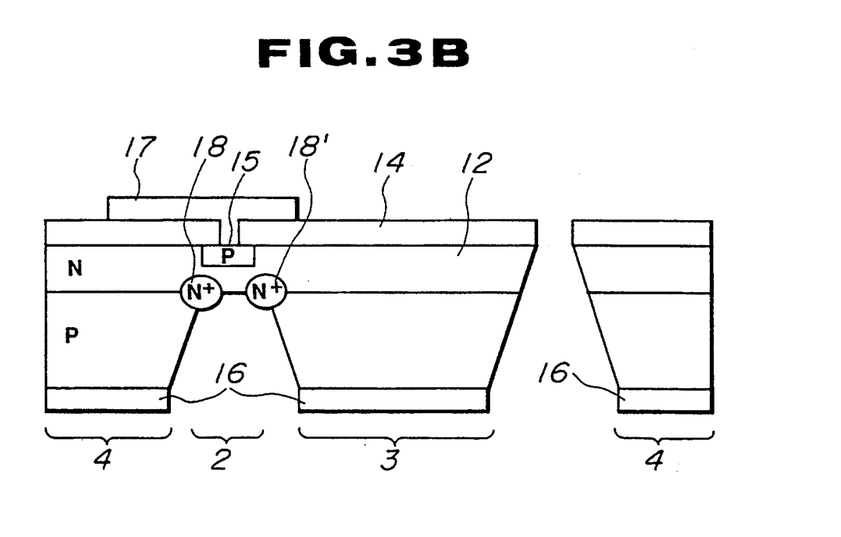

Then, a contact hole for the piezoresistor 15 is formed in the top side oxide film 14, and an interconnection (electrode) conductive layer 17 is formed in this contact hole and on the oxide film 14, as shown in FIG. 3A, The sixth step is an etching step for forming the cavity 10 by etching away unwanted portions of the P substrate 11 and the P diffusion region 13 from the bottom of the silicon substrate 11 while a positive voltage is being applied to the N epitaxial layer 12. The etchant used in this step is an anisotropic alkaline etching liquid such as potassium hydroxide (KOH), or hydrazine. The etchant-resistant insulating layer 16 formed in the fifth step is used as a pattern (or an etching mask). The etchant etches away the P-type material of the P substrate 11 and the P diffusion region 13, but the etching process terminates when it reaches the N regions. Therefore, the cavity 10 formed by this etching step extends upwardly from the unmasked portion of the bottom of the P substrate 11 which is not masked by the insulating layer 16. In the beam portion 2 where the P diffusion 13 is not formed, the cavity 10 reaches the N+ regions 18 and 18' and the middle beam portion which is made by the N epitaxial layer 12, and these N regions stops the etching. In this way, the N+ regions 18 and 18' and the N epitaxial layer 12 are left behind without being etched, and then form the beam portion 2. In the area where the P diffusion region 13 is formed, the P type diffusion region 13 is etched away until the top surface of the epitaxial layer 12 is reached. In this way, this etching process forms the mass portion 3 which is surrounded by the cavity 10 and supported only by the cantilever portion 2.

Then, the insulating layer 16 is cleared away, and the support portion 4 is attached to the base 7, as shown in FIG. 1A. The cavity 10 extends between the mass portion 3 and the base 7 as shown in FIG. 1A, and separates the mass portion 3 from the base 7. The base 7 of this example is formed with a recess having an upward facing bottom surface which confronts the bottom of the mass portion 3.

Figure 4:
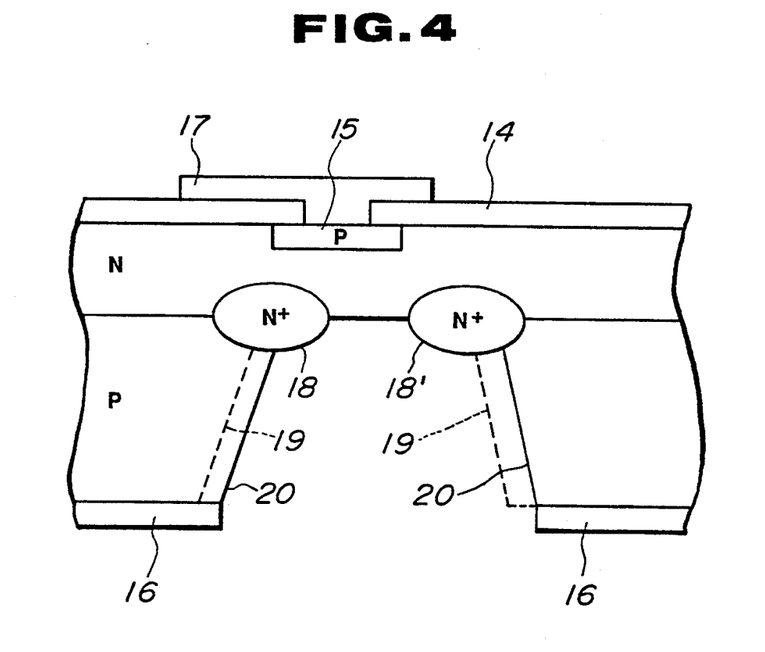
FIGS. 4 and 5 are sectional views for illustrating effects of N+ buried regions 18 and 18' according to the first embodiment of the present invention.
Figure 5:
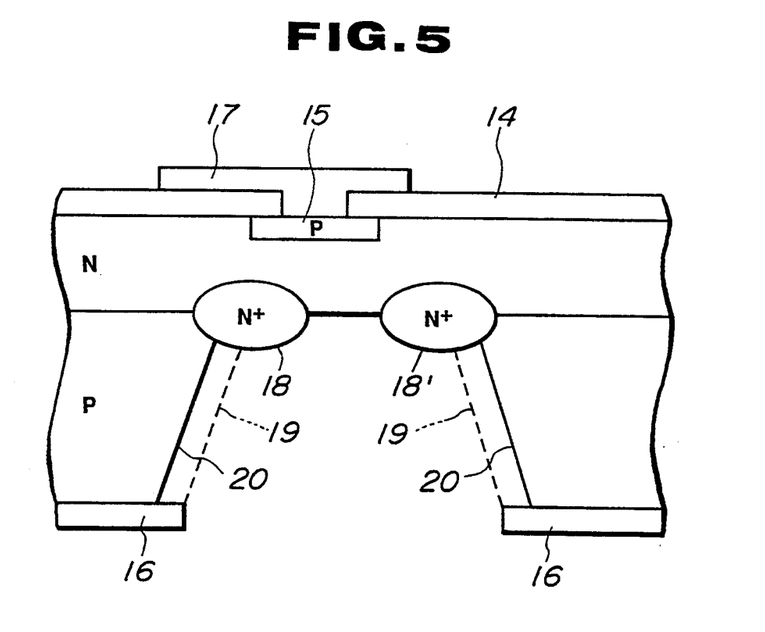

The N+ buried regions 18 and 18' of this embodiment can eliminate or significantly reduce undesired influences of misalignment and overetching, as shown in FIGS. 4 and 5.

In FIG. 4, the pattern of the etch resistant layer 16 is not correctly placed because of an error in alignment. Broken lines 19 indicate correct positions of the side walls of the cavity 10 under the beam 2. The opening formed in the insulating layer 16 is shifted to the right as viewed in FIG. 4, and the side walls are formed along solid lines 20 shown in FIG. 4.

The alignment for patterning the bottom-side insulating layer 16 is achieved by using a double sided mask aligner with respect to the topside pattern on the top surface of the epitaxial layer 12. This double side alignment between the topside and the backside is difficult, and liable to incur alignment errors. Therefore, the misplaced etched profile 20 is a serious problem which can occur frequently.

In the conventional structure, this mistaken profile 20 directly results in a positional shift of the sensing piezoresistor 15 relative to the beam 2, and hence a change in stress distribution due to acceleration in the piezoresistor 15. The conventional acceleration sensor readily suffers a change in sensitivity, from offset.

In the acceleration sensor according to this embodiment of the invention, on the other hand, the N+ buried regions 18 and 18' are formed, from the topside of the semiconductor chip, respectively, in the first connecting portion between the support 4 and the beam 2, and the second connecting portion between the beam 2 and the mass portion 3. These buried regions 18 and 18' can prevent a change in positional relationship between the beam 2 and the sensing piezoresistor 15, and make very small any change in the distribution of stresses applied to the piezoresistor 15. Consequently, the structure and fabricating process according to this embodiment of the invention can reduce variation of sensitivity and offset.

FIG. 5 shows an overetched profile 20 resulting from overetching in the electrochemical etching process for etching the silicon substrate 11 using the patterned insulating layer 16 as an etching mask. In electrochemical etching, overetching to some extent is required because etch rates are not uniform at every site in every wafer, but there are intrawafer non-uniformities within each wafer, and interwafer nonuniformity from wafer to wafer. With overetch, the etchant attacks the P material sidewise and creates the overetched side wall profile 20 which is widened, as shown in FIG. 5, beyond the correct profile 19.

This overetched profile 20 of FIG. 5 also tends to cause the positional change of the sensing piezoresistor 15 relative to the beam 2, and the stress distribution change adversely affecting the performance of the acceleration sensor. In this case, too, the buried regions 18 and 18' of this embodiment can prevent or significantly reduce a change in positional relationship between the beam 2 and the sensing piezoresistor 15, and the change in distribution of stresses applied to the piezoresistor 15. The structure and fabricating process according to this embodiment of the invention can provide reliable acceleration transducers of accurate and uniform characteristics. It is noted that the positions of the buried regions 18 and 18' and the piezoresistor 15 are all determined from the top side in a single-sided manner.

The N+-type buried regions 18 and 18' can cause the thickness of the beam to vary smoothly with no abrupt change. Therefore, the buried regions 18 and 18' can mitigate stress concentration at each end of the beam, and improve the impact resistance of the acceleration sensor (or transducer).

Figure 6:
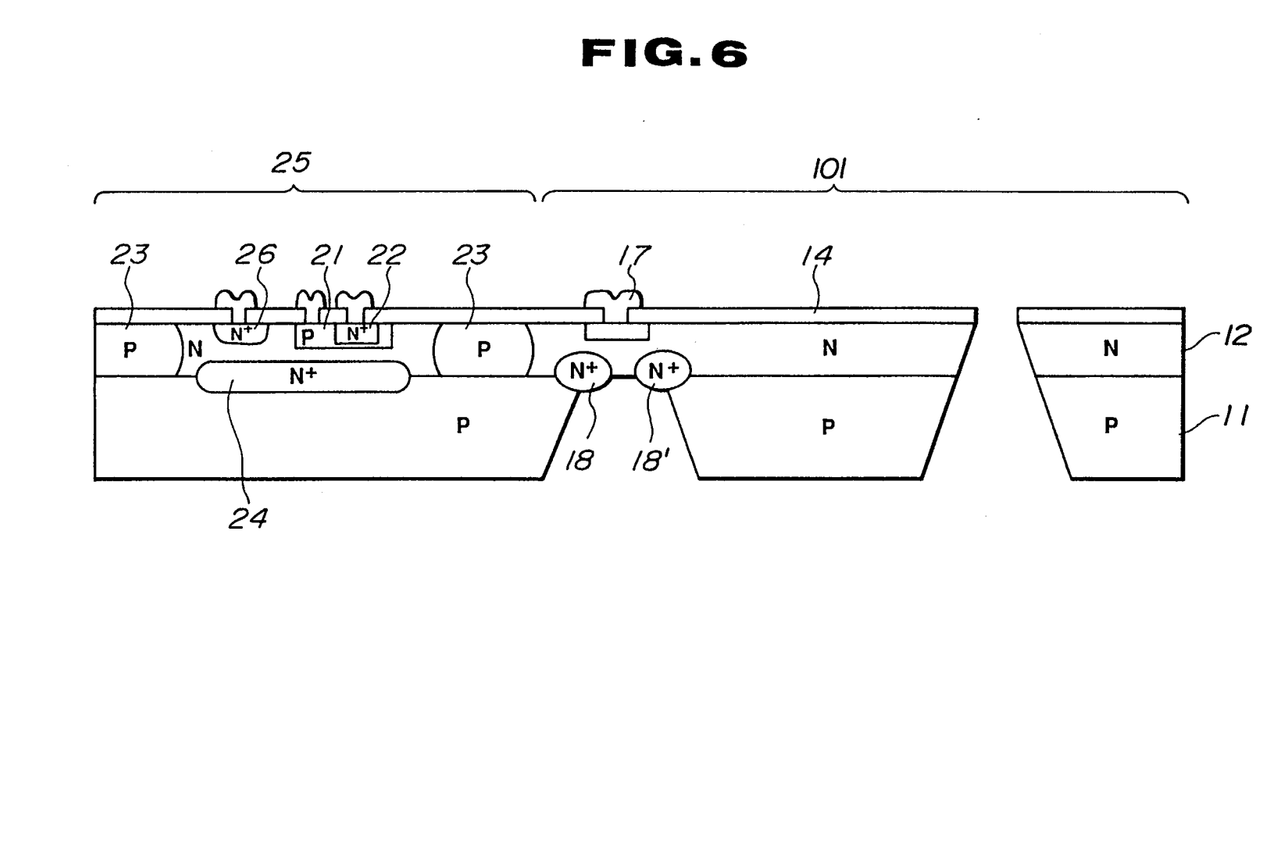
FIG. 6 is a sectional view showing an integrated semiconductor acceleration sensor according to the first embodiment of the present invention.

FIG. 6 shows an integrated semiconductor acceleration sensor according to the first embodiment of the invention. This acceleration sensor includes a semiconductor acceleration transducer 101 and a peripheral circuit which are formed in and on a single semiconductor chip. The semiconductor structure and the fabricating process of the acceleration transducer 101 shown in FIG. 6 are the same as those shown in FIGS. 1A–5. The peripheral circuit may includes an amplifier and/or a circuit for temperature compensation. The peripheral circuit is associated with the acceleration transducer 101 to form a complete acceleration sensing system. In this example shown in FIG. 6, the transducer 101 is integrated with at least an NPN transistor 25 of the peripheral circuit.

The acceleration sensor shown in FIG. 6 includes at least one P-type isolation wall (region) diffused into the N epitaxial layer 12 from the top surface until the P substrate 11 is reached. This P isolation diffusion 23 divides the epitaxial layer 12 into a plurality of N-type regions or islands (or pockets). The NPN bipolar transistor 25 is formed in one of the N type islands. The NPN transistor 25 of this example includes a P-type base diffusion region 21, an N+-type emitter diffusion region 22 formed in the P base region 21, and an N+-type collector diffusion region 26 formed in the N epitaxial island. There is further provided an N+-type buried layer 24 which is buried between the epitaxial layer 12 and the P substrate 11. This NPN transistor 25 acts as an amplifier, for example.

It is possible to form the N+ buried layer 24 of the bipolar transistor 25, and the N+ buried regions 18 and 18' of the acceleration transducer 101 simultaneously by the same doping step. Therefore, the process for fabricating this integrated acceleration sensor requires no additional processing steps, but it can be achieved by slightly modifying the conventional fabricating process.

FIGS. 7A–9B show the structure and the fabrication process of a semiconductor acceleration sensor (or transducer) according to a second embodiment of the present invention.

Figure 7A:
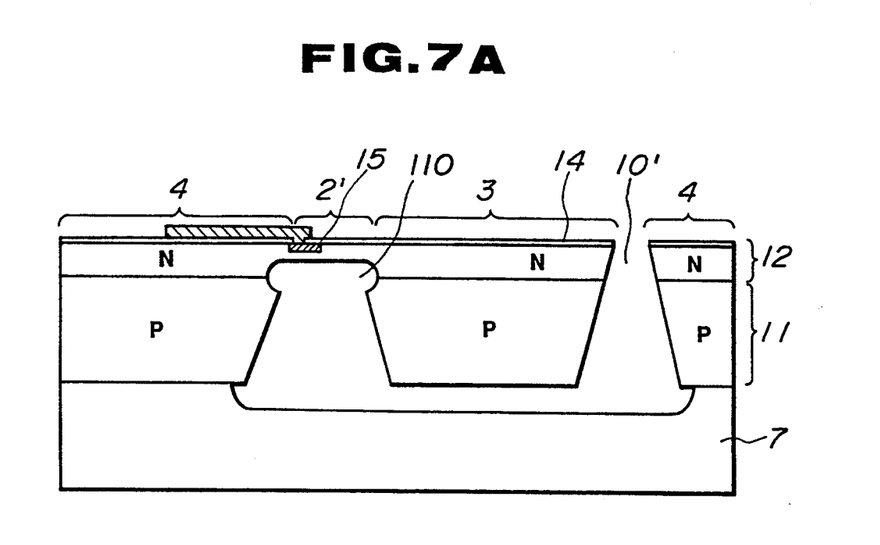
FIG. 7A is a sectional view, taken across a line VIIA—VIIA in FIG. 7B, for showing a semiconductor acceleration sensor according to a second embodiment of the present invention.
Figure 7B:
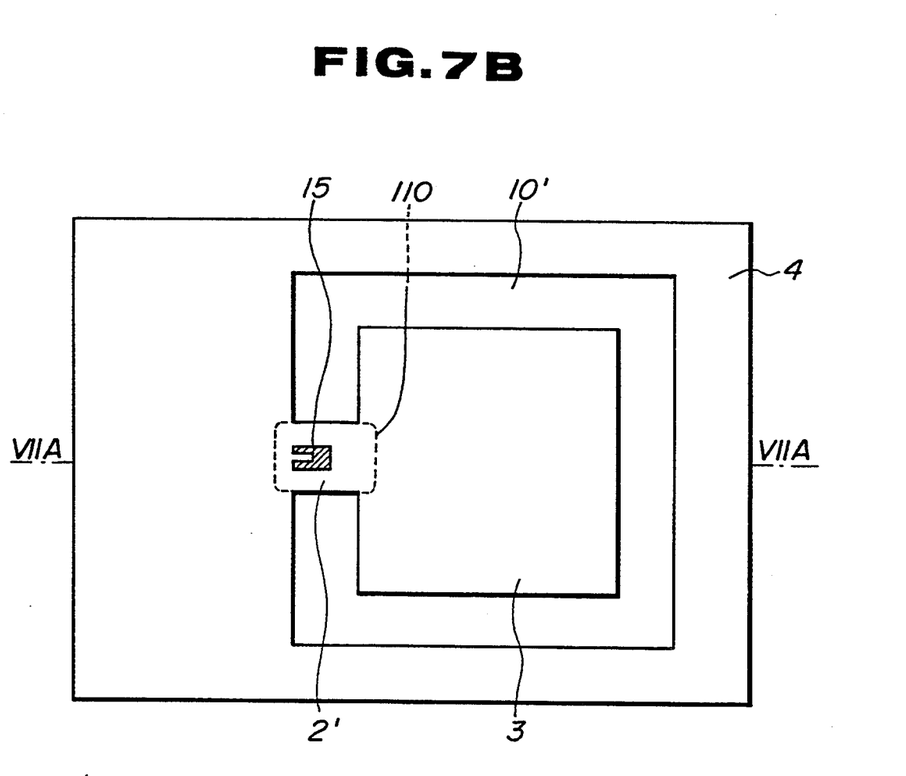
FIG. 7B is a plan view of the semiconductor sensor shown in FIG. 7A.

The silicon sensor chip shown in FIGS. 7A and 7B has a P substrate 11, an N epitaxial layer 12 formed on the substrate 11, and a cavity 10' formed by selective etching. By this selective etching, the sensor chip is shaped to have a silicon beam (cantilever) 2', a silicon mass 3 formed at a movable end of the silicon beam 2', and a silicon support 4 like the sensor structure shown in FIGS. 1A and 1B. The structure of the semiconductor sensor shown in FIGS. 7A and 7B is almost the same as the structure shown in FIGS. 1A and 1B. However, the structure of FIGS. 7A and 7B has a rounded void portion 110, instead of the N+ buried regions 18 and 18'.

Like the sensor of FIGS. 1A and 1B, the solid state acceleration sensor of FIGS. 7A and 7B further includes a sensing piezoresistor 15 and a reference piezoresistor 6 (shown in FIG. 1B, but not shown in FIG.

7B) which are electrically connected to form a bridge circuit.

FIGS. 8A–9B show a process for fabricating the acceleration sensor of FIGS. 7A and 7B. The fabrication process includes at least the following six fabrication steps.

Figure 8A:
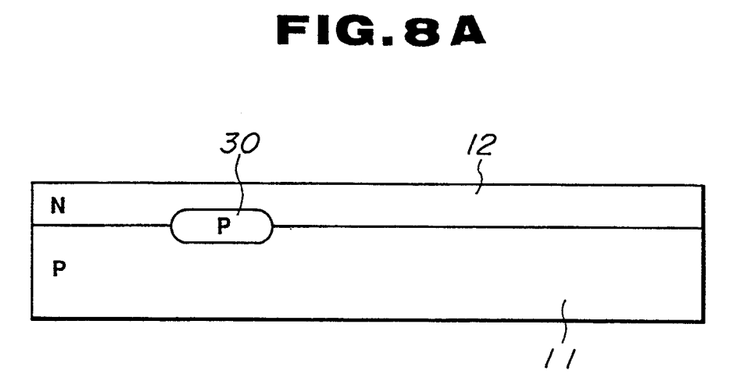
FIGS. 8A-8C and FIGS. 9A and 9B are sectional views for showing a fabricating process for fabricating the semiconductor sensor shown in FIGS. 7A and 7B.

The first step is for forming a P+-type buried layer (or region) 30 in the P-type silicon substrate 11 by diffusion or ion implantation of a P-type impurity, such as boron, from the top surface of the P-type (100) silicon substrate 11.

The second step is for forming the N-type epitaxial layer 12 on the P substrate 11. By this epitaxy step, the buried layer 30 is actually buried under the epitaxial layer 12, as shown in FIG. 8A.

Figure 8B:
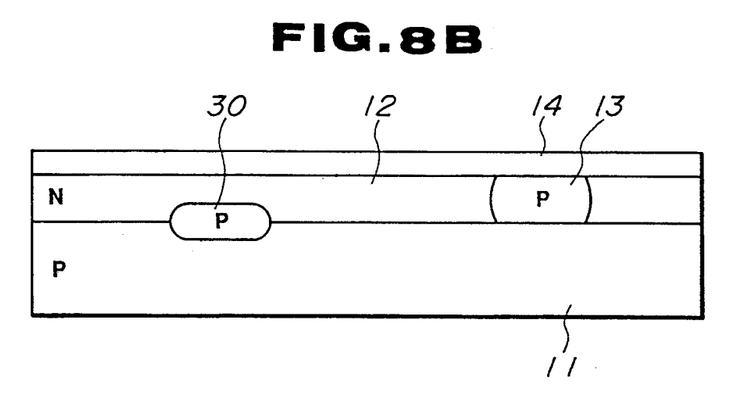

The third step is shown in FIG. 8B. This step is to form a P-type diffusion region 13 as shown in FIG. 8B. This step is achieved by predepositing, on the top surface of the epitaxial layer 12, a P-type impurity such as boron, and diffusing (drive-in) the deposited impurity atoms into the epitaxial layer 12. The thus-formed P diffusion region 13 extends into the epitaxial layer 12 from the top surface of the epitaxial layer 12, and reaches the P substrate 11 as shown in FIG. 8B. The P diffusion region 13 surrounds the mass portion 3 like the gap of the cavity 10' shown in the plan view of FIG. 7B. In this step, an oxide film 14 is formed on the N epitaxial layer 12 as shown in FIG. 8B.

The fourth step is for forming the P-type piezoresistor 15 in the top surface of the N epitaxial layer 12. This step is achieved, for instance, by the ion implantation of boron. The P-type piezo diffused resistor 15 is located directly above the buried layer 30. The P-type diffused resistor region 15 does not reach the buried layer 30. They are separated from each other by the N epitaxial layer 12.

Figure 8C:
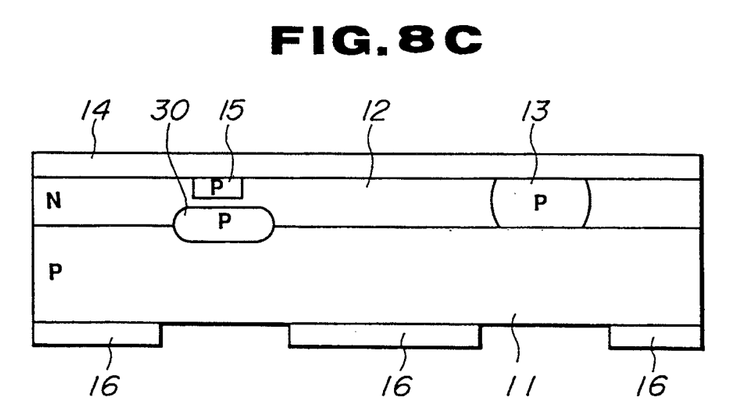

The fifth step is for forming a patterned anti-etch insulating layer 16 on the bottom surface of the silicon substrate 11. In this example, the insulating layer 16 is a silicon nitride layer (of $Si_3N_4$). The step is achieved by forming the silicon nitride layer on the entirety of the bottom surface of the silicon substrate 11, and then patterning the silicon nitride layer 16 by selectively removing an unwanted portion of the silicon nitride layer directly below the piezoresistor 15 and the diffusion region 13 as shown in FIG. 8C.

Figure 9A:
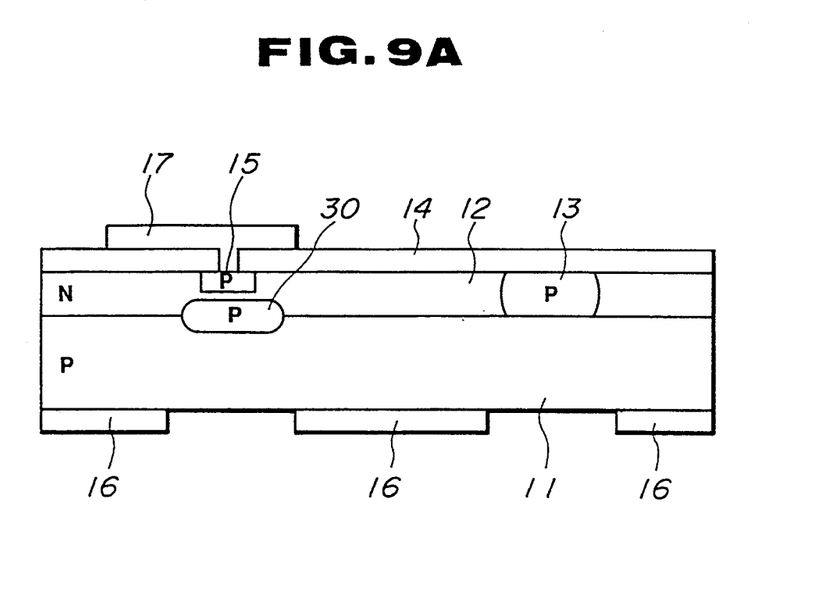

Then, a contact hole for the piezoresistor 15 is formed in the topside oxide film 14, and an interconnection (electrode) conductive layer 17 is formed in this contact hole and on the oxide film 14, as shown in FIG. 9A.

Figure 9B:
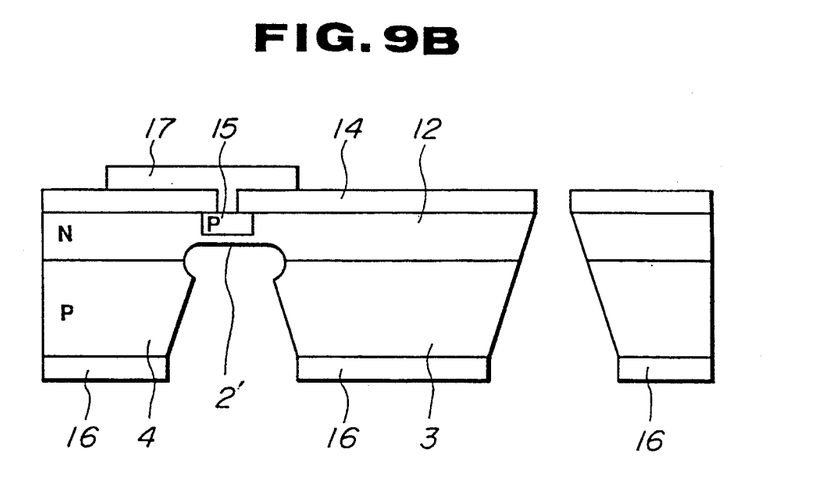

The sixth step is an etching step for forming the cavity 10' by etching away unwanted portions of the P substrate 11 and the P diffusion region 13 from the bottom of the silicon substrate 11 while a positive voltage is being applied to the N epitaxial layer 12. The etchant used in this step is an anisotropic alkali etching liquid such as potassium hydroxide (KOH), or hydrazine. The etchant-resistant insulating layer 16 formed in the fifth step is used as a pattern. The etching process removes the P-type material of the P substrate 11, the P diffusion region 13 and the P buried layer 30, but the etching process terminates when it reaches the N regions. Therefore, the cavity 10' formed by this etching step extends upwardly from the unmasked portion of the bottom of the P substrate 11 which is not masked by the insulating layer 16. In the beam portion 2' where the P diffusion 13 is not formed but the P buried layer 30 is formed, the etching process attacks the P buried region 30 and forms the rounded void portion 110 of the cavity 10'. The N epitaxial layer 12 is left behind above the rounded void portion 110. In the area where the P diffusion region 13 is formed, the P type diffusion region 13 is etched away until the top surface of the epitaxial layer 12 is reached. In this way, this etching process forms the mass portion 3 which is surrounded by the cavity 10' and supported only by the cantilever portion 2'.

Then, the insulating layer 16 is removed, and the support portion 4 of the sensor chip is fixed to the base 7. The cavity 10' extends between the mass portion 3 and the base 7 as shown in FIG. 7A, and separates the mass portion 3 from the base 7. The base 7 shown in FIG. 7A (and in FIG. 1A) has a recess which is formed in the upper surface of the base so that the bottom of the mass portion 3 is spaced from the upwardly facing bottom surface of the recess.

The P impurity atoms of the P diffusion region 30 diffuse upwardly into the epitaxial layer 12. Therefore, the thickness of the beam 2' is smaller than the original thickness of the epitaxial layer 12. The diffusion of the buried layer 30 also proceeds sideways. Therefore, the shape of the side walls of the void portion 110 are determined by a diffusion profile (like a Gaussian distribution). As a result, the void portion 110 formed by etching of the P buried layer 30 has a smoothly curved side wall. At each of the supported end and the movable end of the beam 2', the thickness of the beam 2' increases gradually because of the curvature of the side walls of the void portion 110. The beam 2' is connected with each of the support 4 and the mass portion 3 with a downward facing surface which is curved like a circular arc.

The silicon beam 2' defined by the rounded void portion 110 is less susceptible to stress concentration, and more resistant to damage due to impact. The second embodiment of the invention can increase the yield by preventing damage of the beam during wafer processing, mounting and packaging, and reduce the manufacturing cost per device.

The P buried layer 30 is formed in and near the interface between the P substrate 11 and the N epitaxial layer 12. Like the buried regions of the first embodiment, the P buried layer 30 according to the second embodiment is formed by positioning diffusion, and/or implantation which are all performed from the same top side of the semiconductor chip as the step of forming the piezoresistor 15. That is, the second embodiment can also prevent alignment error, and reduce variation of the sensitivity and offset.

Figure 10:
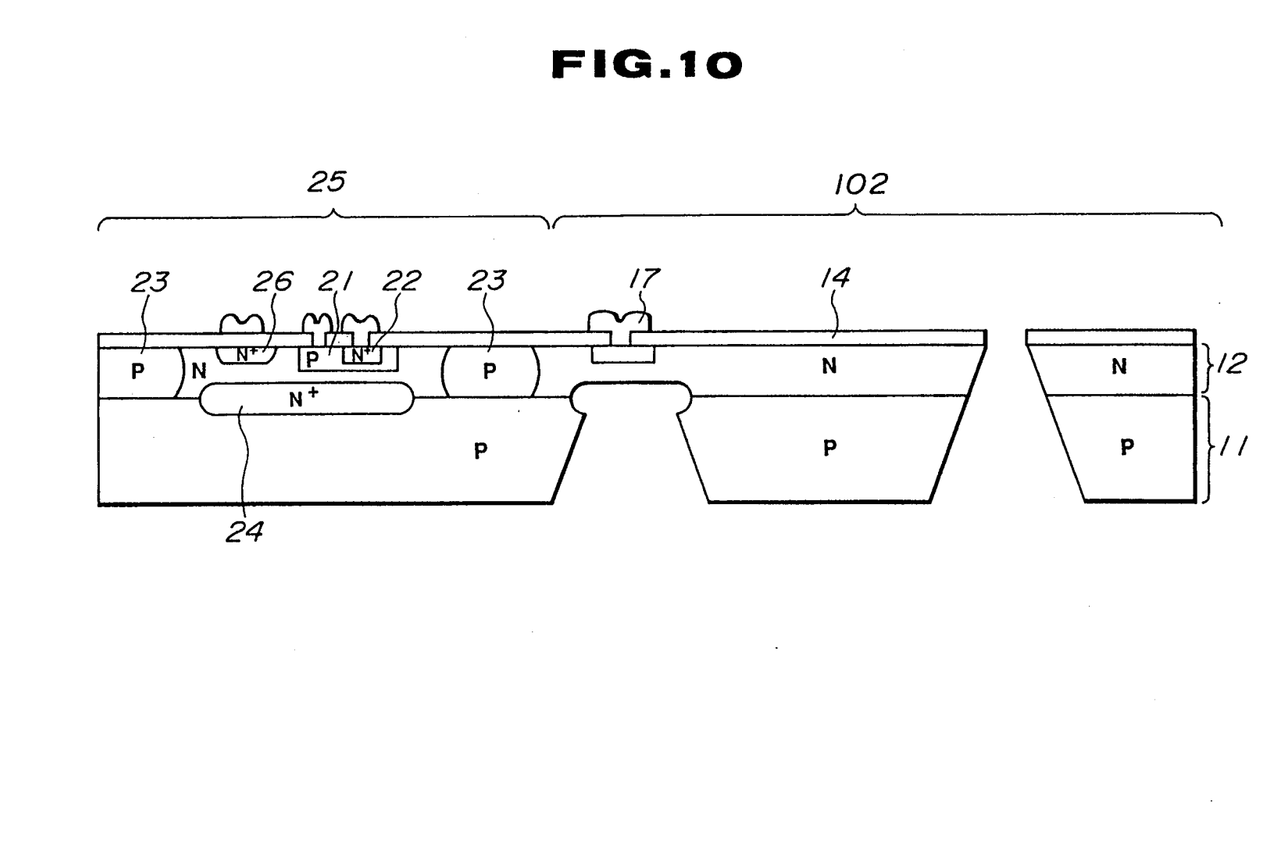
FIG. 10 is a sectional view showing an integrated semiconductor acceleration sensor according to the second embodiment of the invention.

FIG. 10 shows an integrated semiconductor acceleration sensor according to the second embodiment of the invention. This acceleration sensor includes a semiconductor acceleration transducer 102 and a peripheral circuit which are formed in and on a single semiconductor chip. The semiconductor structure and the fabricating process of the acceleration transducer 102 shown in FIG. 10 are the same as those shown in FIGS. 7A–9B. The peripheral circuit may includes an amplifier and/or a circuit for temperature compensation. The peripheral circuit is associated with the acceleration transducer 102 to form a complete acceleration sensing system. In this example shown in FIG. 10, the transducer 102 is integrated with at least an NPN transistor 25 of the peripheral circuit.

The acceleration sensor shown in FIG. 10 includes at least one P-type isolation wall (region) 23 diffused into the N epitaxial layer 12 from the top surface until the P substrate 11 is reached. This P isolation diffusion 23 divides the epitaxial layer 12 into a plurality of N-type islands (or pockets). The NPN bipolar transistor 25 is formed in one of the N type island. The NPN transistor 25 of this example includes a P-type base diffusion region 21 formed in the epitaxial island, an N+-type emitter diffusion region 22 formed in the P base region 21, and an N+-type collector diffusion region 26 formed in the N epitaxial island. In this epitaxial island, there is further formed an N+-type buried layer 24 which is buried between the epitaxial layer 12 and the P substrate 11. This NPN transistor 25 is used as an amplifier, for example.

The integrated acceleration sensor shown in FIG. 10 can be fabricated as follows: First, the epitaxial wafer is formed. This wafer includes the N+-type buried layer 24 and the P-type buried layer 30 which are sandwiched between the P substrate 11 and the N epitaxial layer 12. For example, the P buried layer is formed in a part of the surface of the P silicon substrate 11, and then the N+ buried layer 24 is formed by diffusion of Sb or As in to the top surface of the P substrate 11. Thereafter, the N epitaxial layer 12 is formed on the silicon substrate 11. Then the P diffusion 13 is formed in the epitaxial layer. It is possible to form the P isolation diffusion wall 23 and the P diffusion region 13 simultaneous by the same doping step. The fabrication process further comprises diffusion of boron to form the P base region 21, ion implantation to form the piezoresistor 15, diffusion of phosphorus to form the N+ emitter and collector regions 23 and 26, and selective bottom side etching to form the cavity 10'. The structure and the fabricating process according to the second embodiment is compatible with the IC technology. The acceleration sensor shown in FIG. 10 also has the beam having the smooth profile at each end. Therefore, the acceleration sensor can mitigate stress concentration and improve the impact resistance.

A semiconductor acceleration sensor according to the present invention comprises at least a semiconductor acceleration transducer which comprises at least one semiconductor beam for supporting a semiconductor mass portion serving as a seismic mass and a transducing element for sensing deflection of the beam. The semiconductor beam has a middle portion between first and second beam ends. The lower surface of the beam is not flat, but it is curved in the first and second ends so that the thickness of the beam is increased smoothly.

The present invention is applicable to an acceleration sensor having a mass portion both ends of which are supported, an acceleration sensor having a mass portion supported by four beams, and an acceleration sensor of a diaphragm type.

What is claimed is:

1. A fabricating process for fabricating a semiconductor acceleration sensor including a beam portion and a mass portion supported by said beam portion, said fabricating process comprising:
   a preparing step of forming first and second buried regions of a second conductivity type between a semiconductor substrate of a first conductivity type and an epitaxial layer of the second conductivity type formed on a first major surface of said semiconductor substrate;
   a resistor forming step of forming a diffused resistor region of the first conductivity type in a surface of said epitaxial layer;
   an anti-etching film forming step of selectively forming an anti-etching film on a second major surface of said semiconductor substrate; and
   an etching step of forming the beam portion and the mass portion by selectively etching said semiconductor substrate from said second major surface of said substrate by using said anti-etching film as a pattern;
   wherein said first and second buried regions formed by said preparing step are separated by said epitaxial layer, and said etching step is performed until said epitaxial layer is exposed between said first and second buried regions, thereby reducing effects caused by alignment errors.

2. A fabricating process according to claim 1 wherein said preparing step comprises:
   a first step of forming said first and second buried regions of the second conductivity type extending into said semiconductor substrate of the first conductivity type from said first major surface of said semiconductor substrate; and
   a second step of growing said epitaxial layer of the second conductivity type on the first major surface of said semiconductor substrate;
   wherein said resistor forming step includes a step of forming said diffused resistor region of the first conductivity type by diffusing impurity atoms of said first conductivity type from said surface of said epitaxial layer, said diffused resistor region being formed above a region located between said first and second buried regions, and said diffused resistor region extending into said epitaxial layer from said surface of said epitaxial layer.

3. A fabricating process according to claim 2 wherein said diffused resistor region formed by said resistor forming step is located between said first and second buried regions in a lateral layout of the sensor, and said etching step is performed by anisotropic etching until a part of each buried region is exposed in said beam portion.

4. A fabricating process according to claim 3 wherein said anisotropic etching of said etching step is performed by using an alkaline solution while said epitaxial layer is held at a positive potential.

5. A fabricating process according to claim 4 wherein said semiconductor substrate is a P-type (100) silicon substrate, and said epitaxial layer is an N-type layer.

6. A fabricating process according to claim 5 wherein said fabricating process further comprises a third step of forming a diffusion region of the first conductivity type in said epitaxial layer, so that said diffusion region surrounds a portion in which the beam portion and the mass portion are to be formed; and wherein said etching step is performed until a cavity formed by the etching reaches a top of said diffusion region of the first conductivity type.

7. A fabricating process according to claim 6 wherein, in said third step, said diffusion region of the first conductivity type is formed simultaneously with an isolation wall of the first conductivity type which extends into said epitaxial layer from said surface of said epitaxial layer, and surrounds an island portion of said epitaxial layer.

8. A fabricating process according to claim 7 wherein, in said first step, a buried layer of the second conductivity type is formed simultaneously with said first and second buried regions, and said isolation wall formed by said third step surrounds said buried layer.

9. A fabricating process according to claim 8 further comprises a doping step for forming at least one active region of a transistor in said island portion surrounded by said isolation wall.

10. A fabricating process for fabricating a semiconductor acceleration sensor including a beam portion and a mass portion supported by said beam portion, said fabricating process comprising:
   a preparing step of forming a buried layer of a first conductivity type between a semiconductor substrate of the first conductivity type and an epitaxial layer of a second conductivity type on a first major surface of said semiconductor substrate;
   a resistor forming step of forming a diffused resistor region of the first conductivity type by doping, said diffused resistor region extending into said epitaxial layer from a surface of said epitaxial layer;
   an anti-etching film forming step of selectively forming an anti-etching film on a second major surface of said semiconductor substrate; and
   an etching step of forming the beam portion and the mass portion by selectively etching away said semiconductor substrate and said buried layer from said second major surface of said substrate by using said anti-etching film as a pattern;
   wherein, in said etching step, said buried layer is etched away until said epitaxial layer is bared, thereby reducing effects caused by alignment errors.

11. A fabricating process according to claim 10 wherein said preparing step comprises;
   a first step of forming said buried layer of the first conductivity type extending into said semiconductor substrate of the first conductivity type from said first major surface of said semiconductor substrate; and
   a second step of growing said epitaxial layer of the second conductivity type on the first major surface of said semiconductor substrate;
   wherein said resistor forming step includes a step of forming said diffused resistor region of the first conductivity type by doping, said diffused resistor region being formed above said buried layer.

12. A fabricating process according to claim 11 wherein said diffused resistor region formed by said resistor forming step is located just above said buried layer, and said etching step is performed by anisotropic etching until a cavity formed by the etching reaches an interface between said buried layer and said epitaxial layer.

13. A fabricating process according to claim 12 wherein said anisotropic etching of said etching step is performed by using an alkaline etchant while said epitaxial layer is held at a positive potential.

14. A fabricating process according to claim 13 wherein said semiconductor substrate is a P-type (100) silicon substrate, said epitaxial layer is an N-type layer.

15. A fabricating process according to claim 14 wherein said fabricating process further comprises a third step of forming a diffusion region of the first conductivity type in said epitaxial layer so that said diffusion region surrounds a portion in which the beam portion and the mass portion are to be formed, and wherein said etching step is performed until said cavity reaches a top of said diffusion region of the first conductivity type.

16. A fabricating process according to claim 15 wherein, in said third step, said diffusion region of the first conductivity type is formed simultaneously with an isolation wall of the first conductivity type which extends into said epitaxial layer, and surrounds an island portion of said epitaxial layer.

17. A fabricating process according to claim 16 further comprises a doping step for forming at least one active region of a transistor in said island portion surrounded by said isolation wall.

18. A fabricating process according to claim 1, wherein said beam portion formed by said etching step has an underside which has first and second arched end sections defined by said first and second buried regions, respectively, and a middle section which is defined by said epitaxial layer and which extends between said first and second arched end sections.

19. A fabricating process according to claim 18, wherein said first arched end section of the underside of said beam portion is a convex wall surface the form of which is determined by the boundary of said first buried region, and said second arched end section of the underside of said beam portion is also in the form of a convex wall surface which is determined by the boundary of said second buried region.

20. A fabricating process according to claim 1, wherein said etching step is performed to form a void portion under said beam portion by etching away a portion of said substrate from said second major surface; and each of said epitaxial layer, said first and second buried regions and said substrate is exposed in said void portion formed by said etching step.

21. A fabricating process according to claim 20, wherein said void portion formed under said beam portion by said etching step is bounded by a first side wall which is defined by said substrate and which extends from said second major surface, and reaches said first buried region, and a second side wall which is defined by said substrate, extends from said second major surface and reaches said second buried region.

22. A fabricating process according to claim 10, wherein said etching step is performed until said buried layer is completely etched away, and said epitaxial layer is completely exposed.

23. A fabricating process according to claim 22, wherein said beam portion formed by said etching step has an underside which has first and second arched end sections and a middle section extending between said first and second arched end sections, and each of said first and second arched end sections of the underside of said beam portion is in the form of a concave wall surface.

24. A fabricating process according to claim 10, wherein said etching step is performed until said buried layer is completely etched away, and a rounded void portion is formed under said beam portion; said rounded void portion being bounded by first and second concave side walls.

25. A fabricating process according to claim 10, wherein the thickness of said beam portion formed by said etching step increases gradually and smoothly toward each end of said beam portion.

* * * * *